United States Patent [19]

Patterson et al.

[11] Patent Number: 5,069,626
[45] Date of Patent: Dec. 3, 1991

[54] PLATED PLASTIC CASTELLATED INTERCONNECT FOR ELECTRICAL COMPONENTS

[75] Inventors: Timothy P. Patterson, Costa Mesa; Carl E. Hoge, Encinitas; Joseph Baia, Santa Ana, all of Calif.

[73] Assignee: Western Digital Corporation, Irvine, Calif.

[21] Appl. No.: 569,518

[22] Filed: Aug. 20, 1990

Related U.S. Application Data

[63] Continuation of Ser. No. 456,049, Dec. 26, 1989, abandoned, which is a continuation of Ser. No. 159,692, Feb. 24, 1988, abandoned, which is a continuation-in-part of Ser. No. 69,425, Jul. 1, 1987, abandoned.

[51] Int. Cl.$^5$ .............................................. H01R 9/09
[52] U.S. Cl. ........................................ 439/55; 439/68; 174/52.1; 357/70; 357/74
[58] Field of Search .................. 439/55, 68, 70, 72, 439/78-82; 174/52 FP; 357/70, 74

[56] References Cited

U.S. PATENT DOCUMENTS

| | | | |
|---|---|---|---|
| 3,848,077 | 11/1974 | Whitman | 174/52 S |
| 4,012,766 | 3/1977 | Phillips et al. | 174/52 FP |
| 4,147,889 | 4/1979 | Andrews et al. | 174/52 FP |
| 4,155,615 | 5/1979 | Zimmerman, Jr. et al. | 339/17 CF |
| 4,214,364 | 7/1980 | St. Louis et al. | 29/827 |
| 4,366,342 | 12/1982 | Breedlove | 174/52 FP |
| 4,393,581 | 7/1983 | Cherian | 339/17 CF |
| 4,410,223 | 10/1983 | Baker | 339/17 CF |
| 4,420,767 | 12/1983 | Hodge et al. | 357/81 |
| 4,496,965 | 1/1985 | Orcutt et al. | 357/70 |
| 4,525,597 | 6/1985 | Abe | 174/52 FP |
| 4,530,552 | 7/1985 | Meehan et al. | 339/17 CF |
| 4,554,404 | 11/1985 | Gilder, Jr. et al. | 174/52 FP |
| 4,646,435 | 3/1987 | Grassauer | 174/52 FP |
| 4,681,656 | 7/1987 | Byrum | 29/827 |
| 4,733,292 | 3/1988 | Jarvis | 29/827 |

Primary Examiner—Paula A. Bradley
Attorney, Agent, or Firm—Christie, Parker & Hale

[57] ABSTRACT

A plated plastic castellated interconnect comprises a substrate made from a molded polymeric material and having top and bottom surfaces with a plurality of separate mutually spaced apart castellations integrally molded to the substrate and projecting from the bottom surface of the substrate. A plurality of separate spaced apart recessed regions may be molded in an edge of the substrate and aligned with the castellations. A plurality of metal conductors are plated to the substrate as separate conductive circuit traces, so that each circuit trace extends continuously from the top surface, along the surface of a corresponding recess and to a common plane on a respective castellation at the bottom of the substrate. The plated metal castellations are arranged for soldering or gluing to contacts on a printed circuit board for electrical connection to an electrical component such as an IC chip connected to the circuit traces on the substrate. The plated plastic castellations on one component provide high lead pitch densities, complex configurations, and compliancy of electrical connections to a second electrical component, as well as other advantages.

26 Claims, 10 Drawing Sheets

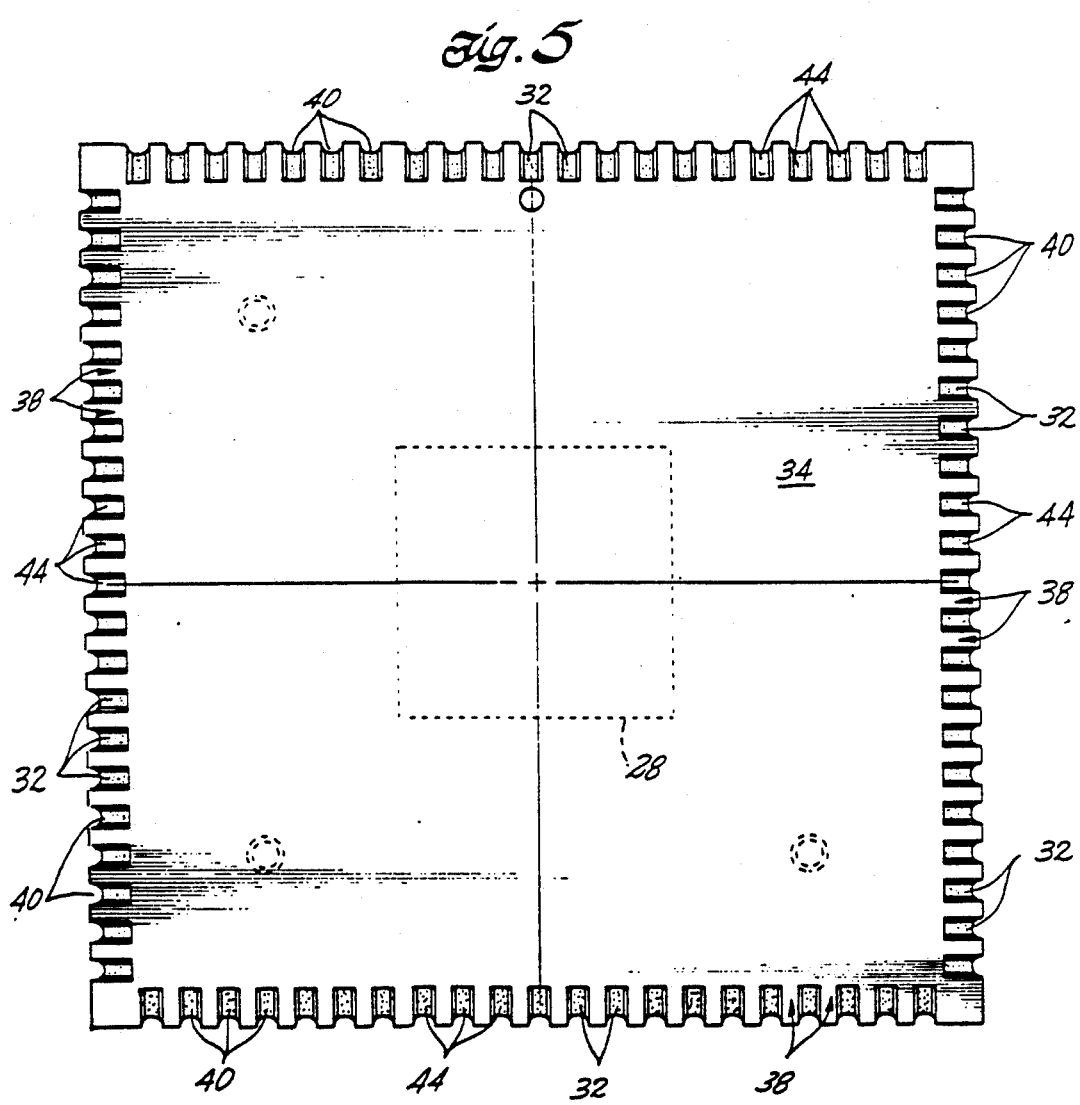

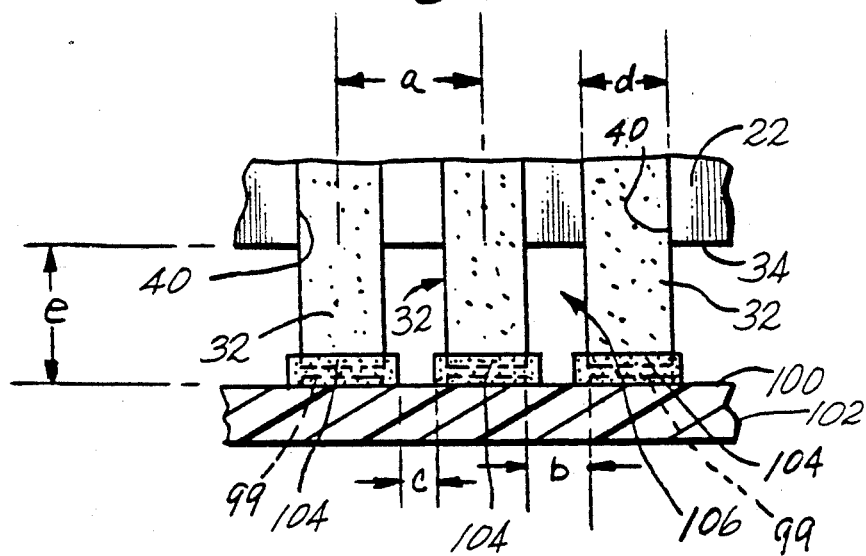
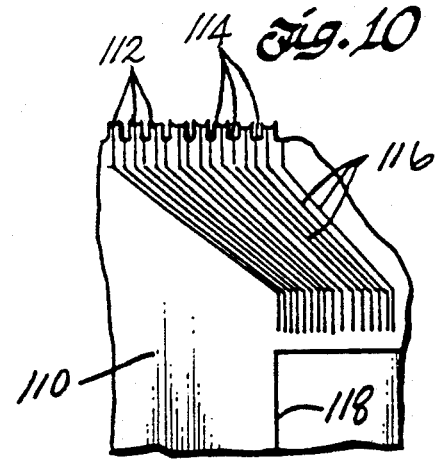

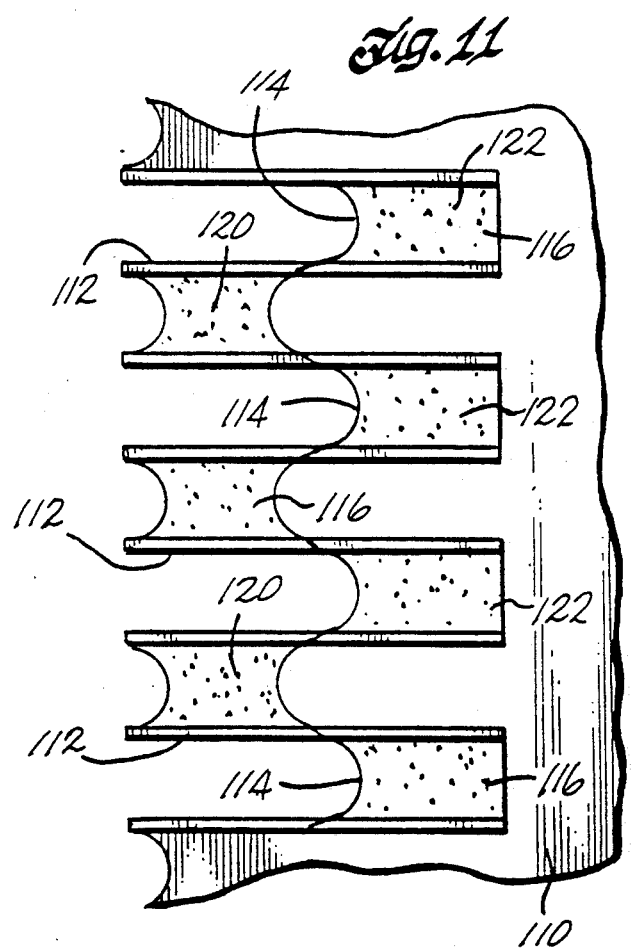

PLATED PLASTIC CASTELLATED INTERCONNECT FOR ELECTRICAL COMPONENTS

CROSS-REFERENCE TO RELATED APPLICATION

This is a continuation of application Ser. No. 07/456,049, filed Dec. 26, 1989 now abandoned, is a continuation of application Ser. No. 07/159,692, filed Feb. 24, 1988 now abandoned, which is a continuation-in-part of our application Ser. No. 069,425, filed July 1, 1987, now abandoned, which is incorporated herein by reference.

FIELD OF THE INVENTION

This invention relates to a plated plastic castellated interconnect used as an interface for interconnecting electrical components.

BACKGROUND OF THE INVENTION

There are a variety of electrical interconnect techniques used for providing connections between electrical components. Interconnects vary widely in their use and function as do the variety of electrical components being connected. Electrical components can be interconnected by soldering, wire bonding, Tape Automated Bonding (TAB), or metal strips, for example. Plated ceramic interconnects also can be used for forming interconnects. These and other interconnect techniques can be used to interconnect a variety of integrated circuit (IC) components, and one example includes the techniques used for packaging of integrated circuit chips and surface mounting them on printed circuit boards (PCB's). The following background description relates to the prior art of forming electrical interconnects used in the packaging of integrated circuit chips and the mounting of IC packages on PCB's. This description is an example only, and is intended to simply provide a better appreciation of the improvements resulting from the present invention as applied to surface connection of electrical components in general. Other applications of the invention will be more fully understood when considering the various embodiments of the invention described in greater detail at a later point.

Perhaps the most widely used technique for packaging integrated circuit chips and mounting them on PCB's is that of encapsulating a chip in an epoxy or ceramic package. In this technique, the chip is first mounted at the center of a plurality of radially extending leads. Then, fine wires are soldered onto wire bonding pads on the chip. The opposite end of each of these wires is soldered to the inner end of one of the radial leads. This process for electrically connecting the chip to the leads with fine wires is called "wire bonding." The chip and the inner end of each radial lead are then encapsulated in epoxy or ceramic, with the outermost end of each lead being left exposed. The exposed ends of the leads are bent downward so that they may be plugged into an integrated circuit chip socket mounted on the printed circuit board. In this way, the chip is electrically and mechanically coupled to the printed circuit board. This method of mounting and packaging integrated circuits has disadvantages, which include the integrated circuit chips being occasionally damaged when wires are soldered to the wire bonding pads on the chip surface.

In one widely used technique for surface mounting IC packages to printed circuit boards, a metal leadframe is used to make electrical connections between an integrated circuit and a PCB. Metal leadframes are stamped or etched from a thin, flat strip of metal to form outwardly extending pin-like members or leads. Generally, the metal leadframe is embedded in a molded plastic body or is otherwise affixed in a ceramic or plastic body with the leads extending out from the sides between the top and bottom surfaces of the body. The leads are typically bent downward along the sides of the body to what is commonly referred to as a J-shape, or a wing shape, or straight down to what has been referred to as a butt end, for allowing the packages to be surface mounted on the PCB. Surface mounting is an arrangement in which the leads are soldered to the surface of the PCB, as opposed to an arrangement in which the leads extend through plated thru-holes in the PCB before soldering.

In one prior art IC package having J-shaped leads, the body has a castellated edge which extends downwardly around the bottom side of the body. Separate leads are bent in an S-shape around the raised castellations. This provides a spacing between the bottom of the IC package and the PCB. U.S. Pat. No. 4,012,766 to Phillips, et al. discloses a semiconductor package and a method of manufacturing of the general type which includes J-shaped leads.

Use of a leadframe has disadvantages. For example, as input/outputs (I/O's) have increased in number, the spacing between leads has decreased so as to prevent the IC packages from becoming excessively large. As a result, the leadframes have been forced to become thinner. For these reasons, normal testing, shipping and handling procedures have become very difficult because of the need to avoid bending the external leads. Any bending of the metal leads can cause a lateral misalignment which can prevent the bent leads from matching up with corresponding contacts on a PCB. Bending of the leads can also cause a non-planar misalignment of the leads at the bottom of the IC package, and, as a result, some of the leads may not be connected to a corresponding contact on the PCB.

Another arrangement for surface mounting of IC packages comprises a printed wiring board in the form of a thin plastic base on which metalized leads are formed in a pattern. The metalized leads are typically formed by laminating copper to the board with an epoxy resin and etching away to form the metalized leads. Holes are drilled in "picture frame" arrays through the thin dimension of the base, from the top to the bottom, and, subsequently, the holes are plated with metal such as copper or gold. The printed metal leads on the top side of the base are then plated with gold or the like to form a pattern of printed leads which fan out from a rectangular central portion of the carrier to the plated thru-holes. Small metalized leads are also formed on the bottom side of the base below the plated thru-holes. An IC chip is then mounted within a cavity in the central portion of the base, and fine conductive wires are bonded between the chip and the ends of the metal leads. The top of the base is then covered with a plastic lid, or potted with epoxy resin. The resulting assembly is placed on a PC board, with the bottom side of the base resting against the top face of the board. Flow soldering techniques are used to form electrical connections between each etched metal lead on the bottom side of the base and a corresponding contact on the PCB.

The plastic IC package with the etched metal traces is useful because there are no self-supporting metal wires or leads which can be bent, inasmuch as the etched metal leads are affixed firmly to the surface of the base and, therefore, do not move. However, this approach has disadvantages because the etched metal leads on the bottom of the base can result in electrical shorts from trace to trace on closely spaced traces when soldering the base to a PCB. This, therefore, limits the pitch of the metal traces of the package, i.e., its capability of being expanded into providing much finer pitches and resulting higher I/O's. The use of printed wiring board techniques, including use of the thick conductive metal leads, also limits the board's applicability to finer lead pitches.

Ceramic leadless IC packages have also been used in the past for mounting integrated circuits to a PCB. One prior art ceramic leadless IC package is disclosed in U.S. Pat. No. 4,525,597 to Abe, in which circuit patterns are printed on a ceramic green sheet with a metalizing paste. An insulating layer is then placed over the metalized pattern on the top surface. The green sheet is then hot pressed to make the top surface concave and the bottom surface convex around a peripheral rim of the ceramic body. The green sheet is then fired. After firing, the ceramic is plated with a conductive metal at positions corresponding to the exposed metal circuit patterns remaining on the ceramic. The step of hot pressing the ceramic body forms a series of spaced apart depressions around the periphery in the top surface, with corresponding stand-off pads on the bottom surface of the ceramic body.

This ceramic IC carrier has several disadvantages. It is limited in its ability to provide fine lead pitches, because the steps involved in forming a ceramic carrier by casting in green sheets, applying a metal paste, hot pressing, firing, and subsequent metal plating techniques limit resolution. These techniques therefore are not adaptable to producing an IC carrier with the geometries necessary to produce a fine lead pitch. In addition, surface mounted ceramic IC packages can be unreliable because thermal transients can develop shear forces at the solder joints and produce fatigue and resulting poor electrical connections. As lead pitches become finer, these problems with ceramic IC packages become magnified. The more reliable ceramic IC packages to date have the self-supporting metal leads which have the disadvantages of the leadframe approach described above.

Thus, the prior art has provided a variety of electronic interconnect techniques for a wide variety of electrical components, including the previously described techniques for surface mounting of IC packages. All of these interconnect techniques have disadvantages or limitations which are overcome by the present invention.

SUMMARY OF THE INVENTION

This invention provides a plated plastic castellated interconnect for use in the surface connection of electrical components. The interconnect includes a first electrical component comprising a substrate made from a molded polymeric material. The molded plastic substrate has first and second surfaces substantially parallel to each other, and a plurality of separate mutually spaced apart molded projections or castellations extending from the second surface to a substantially common plane spaced from the second surface of the substrate. Multiple electrically separated metal conductors are plated to the substrate. The plated conductors extend continuously from the first surface, around or through the substrate, to the common plane on corresponding castellations on the second surface of the substrate. The plated castellations are adapted for connection (mechanical adhesion and electrical correction) to corresponding electrical contacts, leads, terminals, or other conductors on a second electrical component to which the first component is surface mounted.

The plated plastic castellations are made from polymeric materials that result in castellations which are individually compliant, at least on a microscopic level. The compliancy of the individual castellations allows a certain level of flexibility in the individual connections to a second component such as a PCB or other support base. This provides more effective mechanical adhesion and electrical connections than with other prior art surface mount techniques such as solder joints or surface mounted ceramic IC carriers.

The plated plastic castellated interconnect has other advantages when compared with the prior art of surface mounting IC packages. The molded plastic substrate in combination with the plated metal conductors on the castellations allows for much finer lead pitches and resulting higher lead counts than the metal leadframe, printed wiring board, or ceramic IC carrier techniques. The invention also eliminates the additional expense of using metal leadframe techniques, while providing other advantages such as allowing for thorough cleaning of fluxes and contaminants from between an IC package and a PCB.

The plastic substrate can be molded in a variety of geometric configurations for increasing lead pitch densities. These techniques include forming multiple rows of spaced projections along the bottom of the substrate, adjacent alternating recessed areas in multiple rows spaced apart along the edges of the substrate. These and other similar arrangements can increase substantially the lead pitch densities provided by the molded plastic module.

The higher lead pitch densities achieved by the plated plastic interconnect of this invention are not achievable by ceramic IC carriers, especially when compared with the complex configurations into which the module of this invention can be molded to facilitate such higher lead counts. In addition, the molded plastic substrate does not undergo the same firing shrinkage problems characteristic of ceramic IC carriers during fabrication since the mold itself dictates the package dimensions and tolerances. Therefore, much higher precision is achievable for attaining fine pitches.

These and other aspects of the invention will be more fully understood by referring to the following detailed description and the accompanying drawings.

BRIEF DESCRIPTION OF THE DRAWINGS

FIG. 5 is a bottom plan view taken on line 5—5 of FIG. 4;

FIG. 9 is an enlarged fragmentary side elevation view illustrating a portion of the IC carrier mounted to a printed circuit board;

FIG. 10 is a fragmentary top plan view illustrating an alternative embodiment of the invention in which lead pitch density of an IC carrier is increased;

FIG. 11 is a fragmentary top plan view illustrating a portion of the alternative IC carrier shown in FIG. 10;

DETAILED DESCRIPTION

Figure 1:
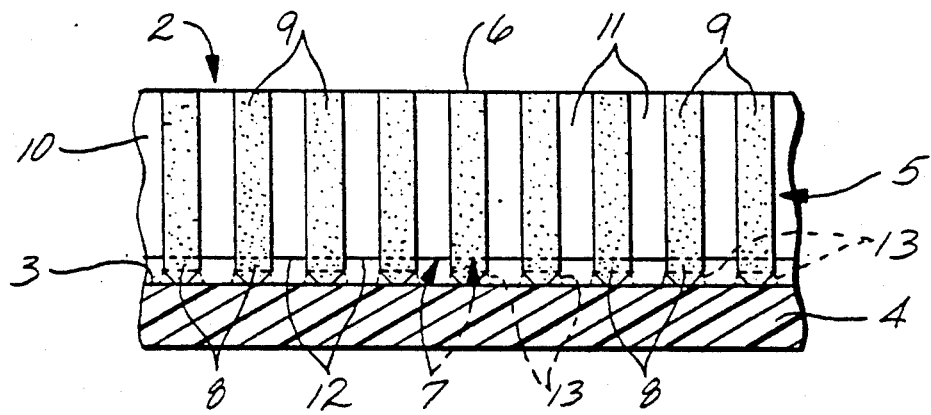
FIG. 1 is a fragmentary semi-schematic side elevation view illustrating a plated plastic castellated interconnect according to principles of this invention.

This invention provides a plated plastic castellated interconnect used for the surface connection of a variety of electronic structures or components. FIG. 1 illustrates general principles of the invention in which the interconnect forms an interface between a first electrical component 2 and a flat upper surface 3 of a second electrical component 4 to which the first component 2 is surface mounted. The first electrical component 2 can be any of a variety of electrical components; and in the illustrated embodiment, the first electrical component 2 comprises a structure or substrate 5 made from a molded polymeric material. The substrate has first and second surfaces 6 and 7 respectively, extending substantially parallel to each other. A plurality of separate mutually spaced apart molded plastic projections or castellations 8 project downward from the second surface toward the flat upper surface 3 of the second electrical component 4. The remote ends of the castellations are preferably in a substantially common plane spaced from and parallel to the second surface of the substrate. Multiple electrically isolated metal surfaces 9 are plated to the substrate. Each plated metal conductor extends continuously from the first surface of the substrate, around a side edge 10 of the substrate, to a common plane on a corresponding one of the castellations on the second surface of the substrate. Alternatively, the plated conductive surfaces could extend from the first surface of the substrate through a thru-hole or via hole (not shown) in the substrate, to the bottoms of the castellations. The non-conductive unplated spaces 11 left on the side edge of the plastic substrate between the plated edge surfaces electrically isolate the row of individually plated metal surfaces. The plated castellations are electrically isolated by the unplated spaces 12 on the second surface of the substrate. The plated conductive surfaces on the substrate thereby form independent continuous electrically conductive circuit connections from the first surface of the substrate to the bottom surfaces of the castellations.

FIG. 1 illustrates one example of a means for electrically interconnecting the first electrical component to the second component. The castellations on the first component can be connected to separate electrical terminals, contacts, leads, lands, or other electrical conductors on the second component. These connections may be made by separate solder joints 13 (shown in dotted lines in FIG. 1), electrically conductive resins, or the like.

The substrate is preferably made from a polymeric material capable of being molded into the castellated configuration such as by injection molding techniques. A presently preferred polymeric material is polyetherimide, although other polymeric materials can be used. Injection molding techniques are desirable because they can be adapted to providing individually narrow and closely spaced castellations to provide controlled fine pitch densities along the rows of plated plastic castellations.

The molded plastic material also produces individual castellations which are compliant, on a microscopic level, in the sense that the individual castellations are able to flex or move relative to one another during use. Preferably, the substrate is made from a thermoplastic material which enhances compliancy, although certain thermoset materials also are suitable. The plastic castellated arrangement makes the resulting interconnect between the first electrical component and the second component compliant in three directions. That is, the castellations are able to flex or move (on a microscopic level) vertically, laterally (parallel to the row of castellations) and inwardly or outwardly at each surface connection. The surface connections are therefore elastic and, as a result, they are able to compensate for thermal expansion during use. This keeps the solder joints 13 continuous, avoiding discontinuities or fracturing due to thermal stresses under heat build-up during use. In one embodiment, the castellations on the substrate and the second component itself can both be made from a plastic material having the same thermal expansion properties, which voids thermal stresses in the solder joints during use.

Other improvements provided by the plated plastic castellated interconnect of this invention will be more apparent from the detailed description below in which the invention is described with respect to its use as an interface for interconnecting various electrical components. Further, certain specific features of the electrical components with which the invention may be used are described in detail in order to provide a better appreciation of the improvements and advantages resulting from the invention.

Use of the Interconnect as an Interface Between IC Carrier and PCB

Figure 2:
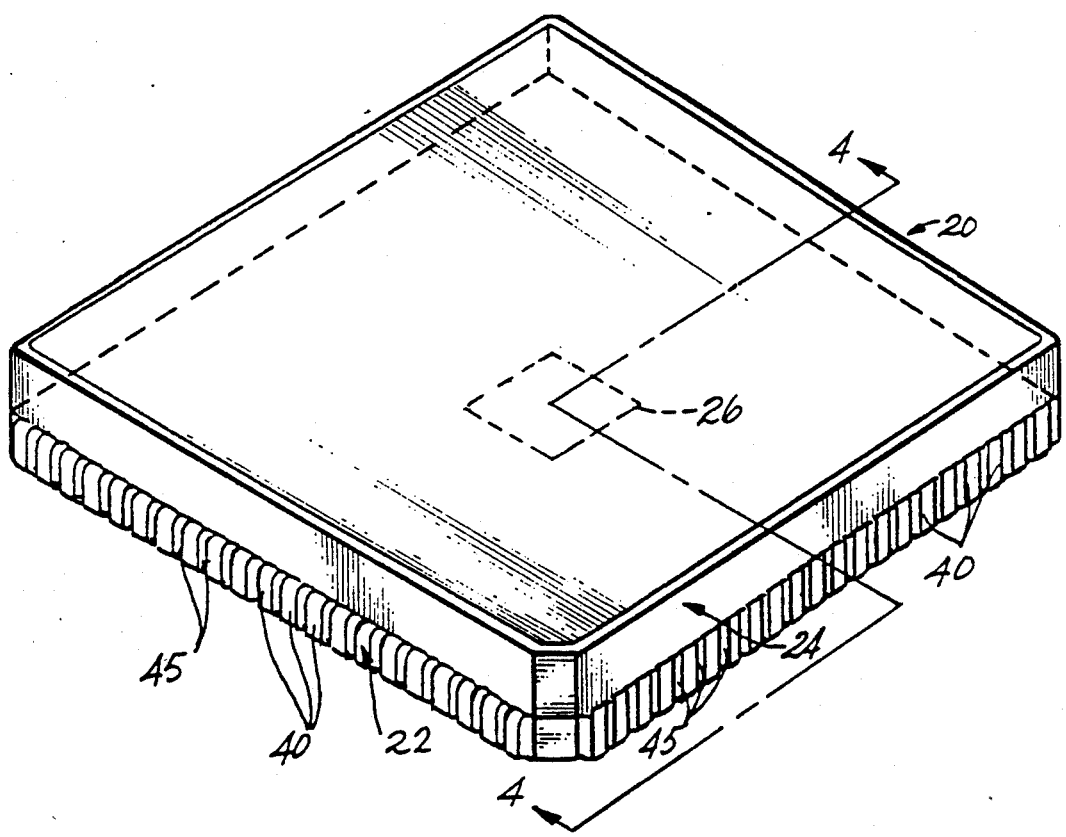
FIG. 2 is a perspective view illustrating use of the plated plastic castellated interconnect in an integrated circuit chip (IC) carrier.

FIGS. 2 through 5 illustrate one embodiment of the plated plastic castellated interconnect used for mounting an integrated circuit (IC) chip to a printed circuit board (PCB). FIG. 2 is a perspective view illustrating basic components of an IC carrier 20 which includes a thin, generally parallelepiped shaped molded plastic base or substrate 22 and a molded plastic lid 24 mounted to the substrate. The carrier encases an IC chip 26 mounted within a housing formed by the molded substrate 22 and lid 24. The carrier plated plastic castellated interconnect surface mounts the IC carrier to a PCB as described below.

Figure 3:
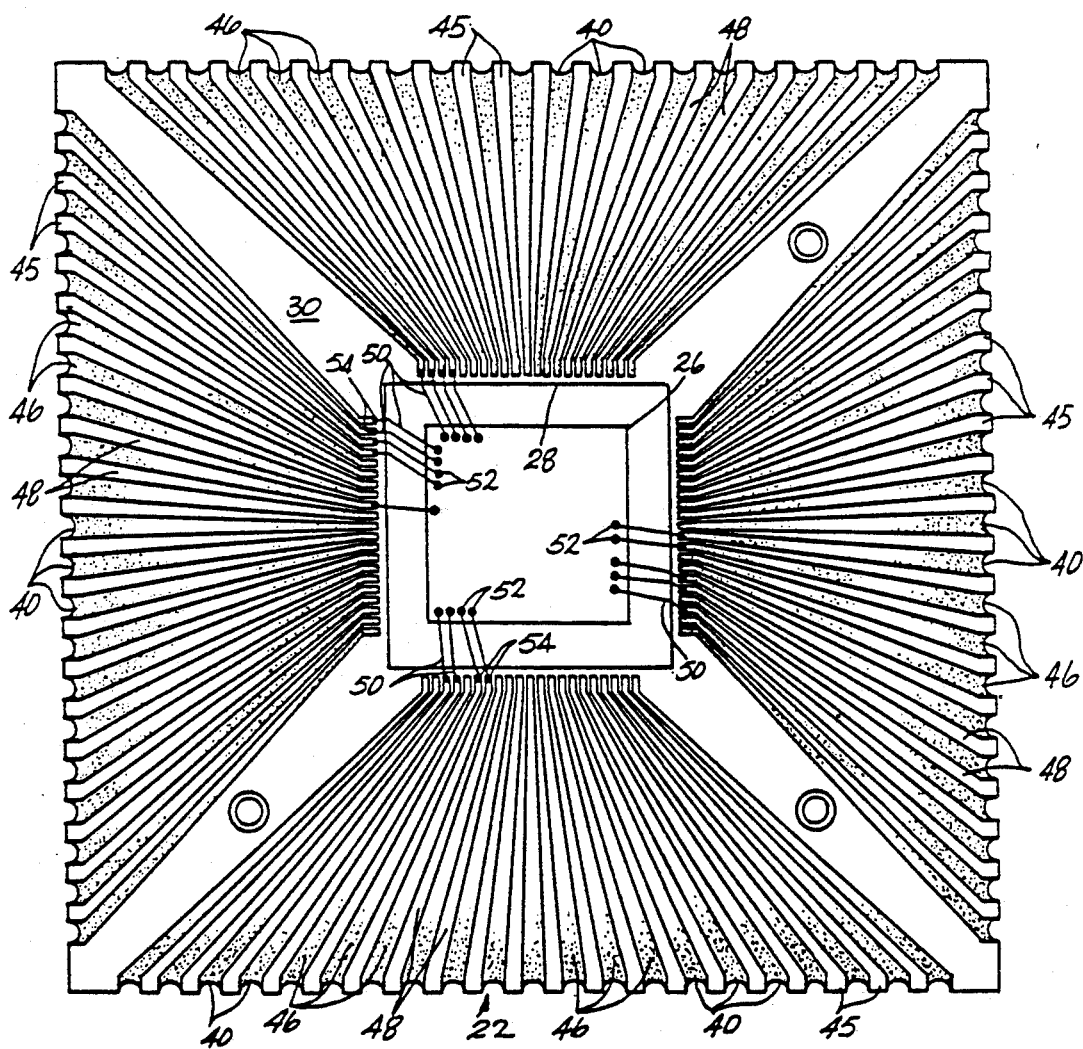
FIG. 3 is a top plan view illustrating metal plated conductors on a top surface of a substrate base portion of the IC carrier.
Figure 4:
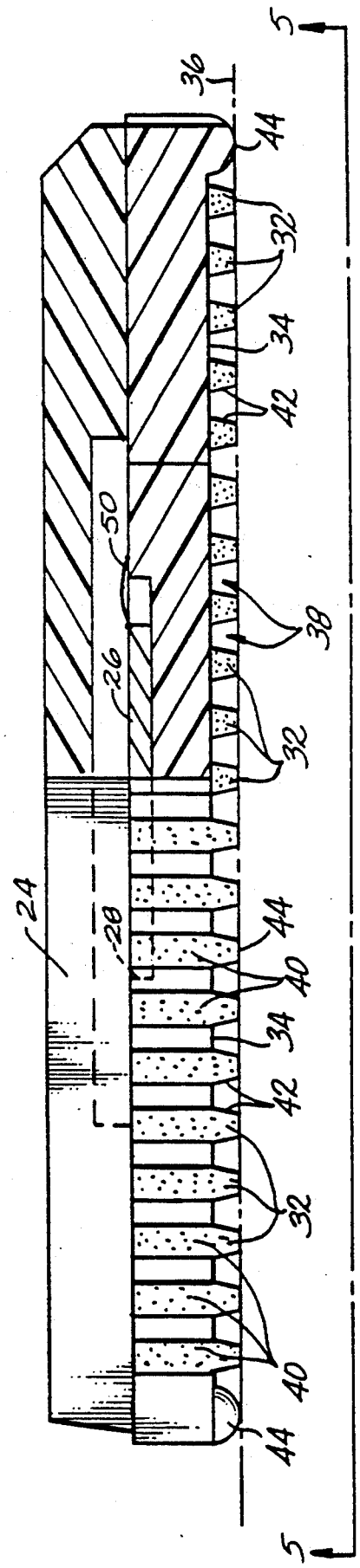
FIG. 4 is a side elevation view, partly in cross-section, taken along line 4—4 of FIG. 2.
Figure 6:
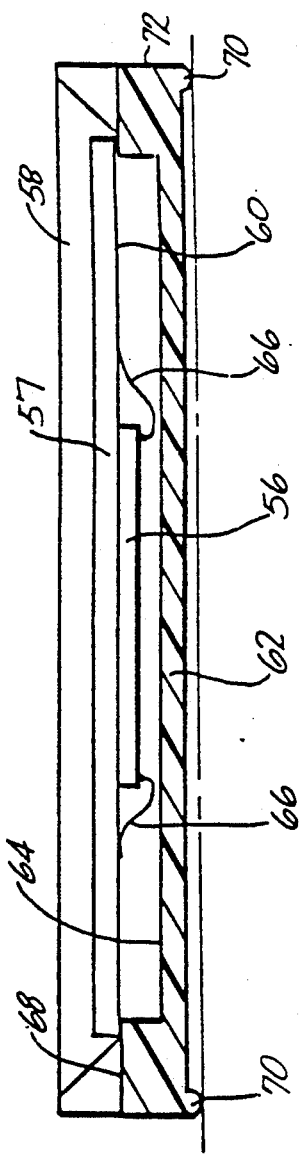
FIG. 6 is a semi-schematic partly cross-sectional view illustrating use of the plated plastic castellated interconnect in an alternative technique for mounting an integrated circuit chip to the IC carrier.

FIGS. 3 through 5 illustrate the detailed construction of one embodiment of the molded plastic substrate 22. The IC chip 26 can optionally be mounted in a cavity in the center of the substrate 22 and then electrically connected to conductive elements on the substrate; or the IC chip can be mounted in a cavity in the underside of the lid and then connected to conductive elements on the adjoining substrate base. In the first instance the combination integrated circuit mounting and packaging assembly is referred to as a "cavity-up" configuration, and in latter instance the assembly is referred to as a "cavity-down" configuration. The embodiment illustrated in FIGS. 3 through 5 comprises a cavity-up configuration of the molded plastic substrate 22; a cavity-down configuration is illustrated in FIG. 6. Both configurations are considered within the scope of this invention.

Referring to FIGS. 3 through 5, the molded plastic substrate has a small generally rectangular-shaped cavity 28 extending downwardly into a central region of a flat upper surface 30 of the substrate. The integrated circuit chip 26 has a rectangular configuration that matches the shape of the cavity, and the chip is mounted within the cavity as shown in FIG. 3. The substrate also has separate rows of individual castellations 32 mutually spaced apart from one another and extending downwardly from a flat undersurface 34 of the substrate. The rows of castellations 32 extend downwardly along the perimeter portion of the flat undersurface of the substrate. The castellations are uniformly spaced apart along each edge of the rectangular-shaped substrate, and the castellations in each row are aligned on a common axis. The projections also are of uniform size and shape and all extend from the bottom face of the substrate to a common plane 36 shown in FIG. 4. This arrangement forms uniformly spaced gaps 38 between adjacent castellations around the rectangular perimeter of the substrate.

Separate rows of mutually spaced recesses 40 are formed along the outer side edges of the substrate in vertical alignment with corresponding castellations on the underside of the substrate. In the illustrated embodiment, the recesses 40 are each semicircular (when viewed in plan view as in FIG. 5), and each recess extends continuously from the edge of the flat top surface 30 to the flat bottom surface 34 of the substrate. The castellations 32 are each located immediately inboard from each corresponding recess 40 so that the surface of each recess continues uninterrupted around the outer surface of each corresponding castellation located behind and below it. The maximum width of each castellation thus matches the maximum width of each recess (as shown in FIG. 4). Each castellation also has downwardly tapered side walls 42 best shown in FIG. 4. The bottom surface 44 of each castellation 32 is rounded, preferably in a semicircular configuration as shown best in the side view portion of FIG. 3. As mentioned previously, the rounded bottom portions of the castellations lie in the common plane 36. The individual recesses 40 spaced apart along each outer edge of the substrate are separated by corresponding castellations 45 intervening in the spaces between adjacent recesses.

As shown best in FIG. 3, a plurality of separate metal conductors 46 are plated on the flat top surface of the substrate. The conductors are arranged in four groups which fan outwardly from the vicinity of each of the four sides of the rectangular cavity 28 toward corresponding outer edges of the rectangular substrate. Each metal conductor plated to the substrate extends to a corresponding recess 40 formed in the outer edge of the substrate. In the illustrated embodiment, the carrier has 84 conductors, 21 per side.

The metal conductors are plated to the substrate so that they are directly bonded to its surface. The conductors are preferably applied to the surface by a combination of electroless plating and electroplating techniques described below. These techniques plate the molded plastic substrate with one or more layers of essentially pure deposited metal while the resulting metal layer is being bonded directly to the substrate. A combination of copper, nickel and gold is preferably used to form the plated metal conductors, although other metals capable of being plated to the surface of the molded plastic substrate can be used.

The plated conductors are applied in thin layers and therefore are referred to herein as conductive metal circuit traces. They are electrically separated from one another by the electrically insulative plastic material of the substrate body which occupies the spaces 48 on the surface between the individual conductive traces. These narrow insulative spaces formed by the flat surface of the substrate body thereby fan outwardly toward corresponding electrically-insulative projections 45 at the periphery of the substrate. The circuit traces 46 extend continuously from the top surface of the substrate, around the upright faces of the recesses 40, and then around the rounded bottom surfaces 44 of the castellations 32. The bottom surfaces of the castellations, at least in the plane 36, are plated with the electrically conductive metal traces.

Thus, each conductive trace on the substrate forms a continuous electrical lead from the substrate top surface, around the edge of the substrate, to the bottom portion of a corresponding castellation 32 on the bottom of the substrate. The circuit traces which are plated to the upright semicircular faces of the recesses 40 are electrically insulated from one another by the corresponding castellations 45 that separate the recesses along the outer edges of the substrate. Further, the electrically conductive traces on the curved bottom portions of the castellations 32 are electrically insulated from one another by the space gaps 38 that separate the individual castellations along the substrate bottom surface. Owing to the electrical separation of the castellations from one another, the integrated circuit carrier can be surface mounted on a PCB having its top surface in the plane 36 shown in FIG. 4. This leaves the space gaps 38 between the bottom surface 34 of the substrate and the top of the printed circuit board, as well as the open gaps between conductive surfaces on adjacent bottom castellations 32. Further details relating to mounting of the integrated circuit carrier to a printed circuit board are described below.

The integrated circuit carrier also includes means for mounting the integrated circuit chip 26 within the housing formed by the carrier. In the cavity-up configuration, the conductive metal traces 46 are electrically connected to the integrated circuit chip 26 by corresponding fine wire leads 50. These fine wire leads are metallurgically bonded between individual spaced bonding pads 52 on the integrated circuit and corresponding bonding points 54 on the individual conductive metal traces 46. In a typical arrangement, the fine wire leads from the integrated circuit are separately connected to certain of the metal traces and need not be connected to all of the conductive metal traces. The connections between the integrated circuit and the conductive metal traces illustrated at FIG. 3 are simply an example showing connection between the integrated circuit and any desired number of the electrically conductive traces. Thus, a separate electrical circuit is formed between each lead from the integrated circuit chip across the integrated circuit carrier surface and to the bottom surface of the carrier to a separate one of the bottom castellations 32 which, in turn, are bonded to corresponding contacts on the printed circuit board.

As mentioned previously, FIGS. 3 through 5 illustrate the cavity-up configuration in which the integrated circuit chip is mounted to the substrate and connected directly to corresponding electrically conductive traces on the substrate. In an alternative arrangement, illustrated in FIG. 6, an integrated circuit chip 56 can be mounted in the cavity-down configuration. In this arrangement, the integrated circuit chip 56 is affixed to a spreader 57 carried on a package 58. The spreader has a downwardly facing surface 60 having metal traces (not shown) fanning outwardly from the integrated circuit chip in a manner similar to the top surface 30 of the substrate 32. In the cavity-down arrangement, the molded plastic substrate 62 includes a large central cavity 64 to provide space for the downwardly projecting integrated circuit chip 56. Separate fine wire leads 66 electrically connect wire bonding pads on the integrated circuit to corresponding conductive metal traces on the spreader 57. The electrically conductive traces on the spreader are soldered, cemented, or otherwise electrically connected to corresponding electrically conductive traces on the top side 68 of the substrate 62. Electrical contact is achieved between the spreader and the substrate by means of the adhesive, solder or cement which form discrete, electrically isolated lands between the two surfaces.

The molded plastic substrate 62 includes the spaced apart castellations 70 extending along the outer periphery of the bottom surface of the substrate. Corresponding spaced apart recessed regions (not shown in FIG. 6) extend along the outer side walls 72 of the substrate, in vertical alignment with the bottom castellations. As with the embodiment illustrated in FIGS. 3 through 5, the upright faces of the recesses and the bottom castellations 70 are plated with the electrically conductive metal circuit traces to provide individual continuous electrically conductive paths from the bottoms of the castellations 70 to the fine wire leads 66 of the integrated circuit 56.

Processing Techniques

Figure 7:
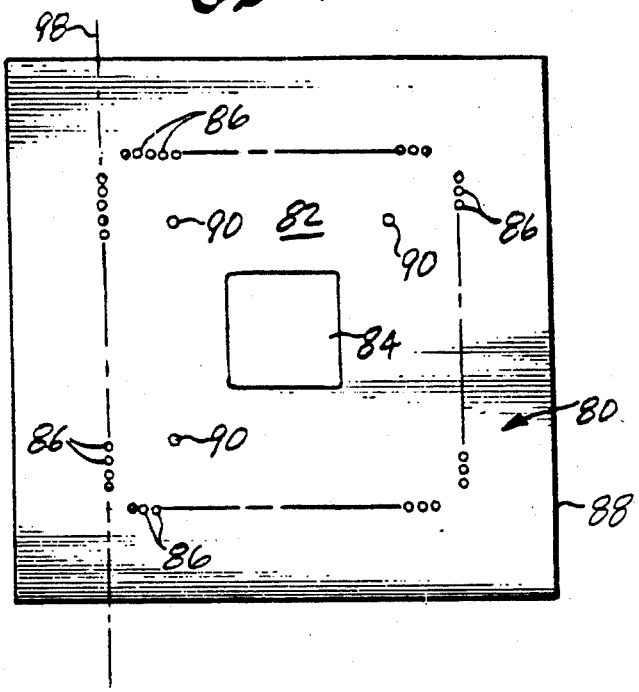
FIG. 7 is a top plan view illustrating a molded substrate base portion of an IC carrier during a preliminary step in a process for manufacturing the IC carrier.
Figure 8:
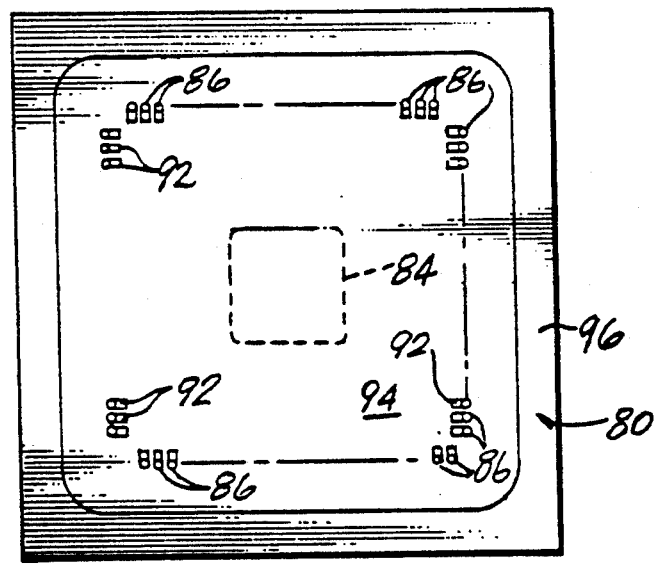
FIG. 8 is a bottom plan view of the opposite side of the substrate shown in FIG. 7.

FIGS. 7 and 8 illustrate one embodiment of a method for making the substrate base portion of the integrated circuit carrier. The substrate is preferably made by injection molding techniques in order to first form a molded plastic base 80 of thin, parallelepiped shape. The molded plastic base has a flat top surface 82 with a shallow rectangular shaped recess 84 in its center. Four rows of holes 86 extend through the depth of the base 80. The rows of holes are uniformly spaced outwardly from the four sides of the central recess. The four rows of holes are also uniformly spaced inwardly from the four outer edges 88 of the base. The upper surface 82 of the base 80 also includes three shallow recesses 90 which register with three corresponding alignment pins on the underside of the lid when the lid 24 is mounted to the integrated circuit carrier. The molded plastic base 80 further includes four rows of spaced apart castellations 92 extending from a flat bottom face 94 of the base 80. The rows of molded bottom castellations 92 are immediately inboard from the holes 86, and the configuration of the castellations 92 and their positioning with respect to the holes is identical to the castellations 32 on the substrate illustrated in FIGS. 3 through 5. The bottom face of the base 80 also includes a peripheral surface 96 which is raised slightly from the shallow recessed face 94 on which the castellations are formed. This raised outer peripheral surface 96 provides a flat surface in the same plane as the bottoms of the castellations 92.

As alluded to previously, the molded plastic base 80 shown in FIGS. 7 and 8 can be made from a variety of plastic materials capable of forming the base by injection molding techniques. Injection molding techniques are preferred because the entire topography of the base 80 shown in FIGS. 7 and 8 can be injection molded as a single integral unit, with retractable pins (not shown) used in the mold for forming the rows of spaced apart holes 86. Injection molding techniques also result in producing a desired configuration of the bottom castellations 92. The castellations also can be molded so they are individually narrow and closely spaced to provide a fine pitch density of castellations along the rows of corresponding holes. The injection molded plastic material also results in the individual castellations being compliant, on a microscopic level, as described previously.

Following injection molding of the plastic base 80, the surfaces of the base are activated by a suitable sizing material to enhance bonding of the electrically conductive metal plating to the base 80. After activating the surfaces, a conductive metal such as copper is first plated onto all surfaces of the base. In a preferred technique, a continuous film of electroless copper is first plated on the base, preferably in a film thickness of about ten micro-inches. The copper is then patterned using lithographic techniques and etched followed by depositing a one mil thick film of electrolytic copper. Approximately 100 to 150 micro-inches of nickel are then electroplated over the copper, followed by an approximately 50 micro-inch layer of gold. These dimensions and materials can vary without departing from the scope of the invention. The plating techniques also can vary.

Briefly, electroless plating comprises applying a coating of metal from an electrolytic solution of a salt containing ions of the metal being deposited. The coating is deposited without applying electrical current but by chemical reduction. Electroplating comprises applying the coating of metal by passing an electric current through an electrolytic solution of a salt containing ions of the metal being deposited. Metal sputtering techniques also can be used and these include applying the coating in a vacuum tube having metal ions emanating from a cathode and deposited as a film on the object contained within the tube. Three phases of this technique comprise generating a metal vapor, diffusion of the vapor, and condensation. Vacuum metalizing techniques also can be used and these include applying a coating of metal by evaporating the metal under high vacuum and condensing it on the surface of the base material. Applicable electroplating, electroless plating, and sputtering techniques are described in MODERN PLASTICS ENCYCLOPEDIA, 1986–1987, pp. 370–371; and 1984–1985, pp. 372–374. Applicable vacuum metalizing techniques are described in MODERN PLASTICS ENCYCLOPEDIA, 1986–1987, pp. 381–382. Plastics injection molding techniques are described in MODERN PLASTICS ENCYCLOPEDIA, 1983–1984, pp. 248–271; and 1984–85, pp. 258–281. These disclosures are incorporated herein by this reference.

These techniques for forming a thin metal film on the substrate are referred to herein as "plating" techniques in the sense that they deposit on the base a thin film or layer, or multiple layers, of essentially pure metal which is bonded directly to the surface of the base. The metal layer which is plated to the base is continuous and covers the top and bottom surfaces, the side edges, and the entire upright face of the holes 86 in the base. The plated metal film is applied in a thin film thickness which allows etching away to effectively form the electrically separated metal circuit traces. The plating techniques allow etching away to form conductive traces which are individually narrow and closely spaced apart in a high pitch density. Conductive traces with a width as low as about six mils and an on-center spacing as low as about ten mils can be formed by such plating and etching techniques.

Following metal plating of the base 80, certain regions of the plated metal are removed from the base to form the resulting pattern of separate electrically conductive traces on the base. The metal is removed by conventional lithography and etching techniques which leave the narrow electrically insulative surfaces between the conductive metal traces. The resulting metal traces are continuous across the top surface, down through the holes 86 and around the bottom surfaces of the castellations 92 at the base of the plastic substrate.

Following the plating step, the base is severed along straight lines extending through the centers of each row of the holes 86. One of the lines along which the base is severed is shown at 98 in FIG. 7. This produces the rectangularly-shaped (square) substrate shown in FIGS. 3 through 5 in which the metal plated semi-circular recessed regions are spaced apart along each side edge of the substrate.

Several additional advantages are provided by the techniques for forming the interconnect module according to this invention. For instance, injection molding techniques can be used to produce integrally molded plastic interconnect modules with any desired topography, including geometries that can provide a fine pitch density of the conductive metal traces. The combination of injection molding in a desired configuration, with metal plating and subsequent removal of the metal in the desired areas, allows the fine pitch density to be provided effectively from the top surface, through the recessed portions of the substrate, to the castellations on the bottom of the module. The result is a leaded castellated interconnect module without the disadvantages resulting from use of a separate metal leadframe. These techniques also are advantageous in providing an IC carrier with castellations in a desired pattern to match the footprint pattern of the contacts on the PCB to which the carrier may be mounted.

Following plating and etching to form the pattern of conductors on the carrier 20, the IC chip 26 is mounted to the recess in the carrier, and the chip is wire bonded to the conductive metal traces. The plastic lid 24 is then placed on the carrier and bonded to it with a resin such as an epoxy resin. The lid-glue combination encapsulates the IC chip.

Alternative Geometries of Plated Plastic Castellated Interconnect

FIG. 9 schematically illustrates surface mounting of the IC carrier to a PCB. The castellations 32 at the base of the substrate 22 project downwardly from the bottom surface 34 of the substrate for electrical connection to corresponding electrical contacts 99 on a top surface 100 of a printed circuit board 102. The bottoms of the castellations are electrically connected to the contacts on the board by separate solder joints 104 or electrically conductive resins which are electrically separated from one another. FIG. 9 illustrates that each plated electrical conductor is electrically separated from the adjacent conductor and, due to its placement on the corresponding castellation, it is spaced away from the bottom side of the base. As a result, the carrier, including the base, can be mounted to the PCB and soldered or glued to the contacts 99 on the board, while leaving the gap 106 between the bottom of the base and the top of the board. This gap allows cleaning under the base and makes it easier to avoid electrical shorts between the plated electrical leads.

The surface-mounted integrated circuit carrier illustrated in FIG. 9 depicts dimensions of a typical castellated plastic interconnect module that can be produced according to principles of this invention. In the illustrated embodiment, the projecting contacts 32 are spaced apart by an on-center dimension a of 0.025 inch. The lateral distance b between adjacent castellations is 0.010 inch. The lateral spacing c between adjacent soldered joints 104 is about 0.007 inch. The width d of each castellation is about 0.015 inch. The spacing between the bottom surface of the integrated circuit carrier 22 and the top surface of the printed circuit board is about 0.020 inch. The IC carrier of this invention can be produced with its metal leads in a fine pitch density in the sense that conductors 46 can be spaced apart by an on-center spacing of about 25 mils or less, with a spacing between conductors of about ten mils or less.

Figure 12:
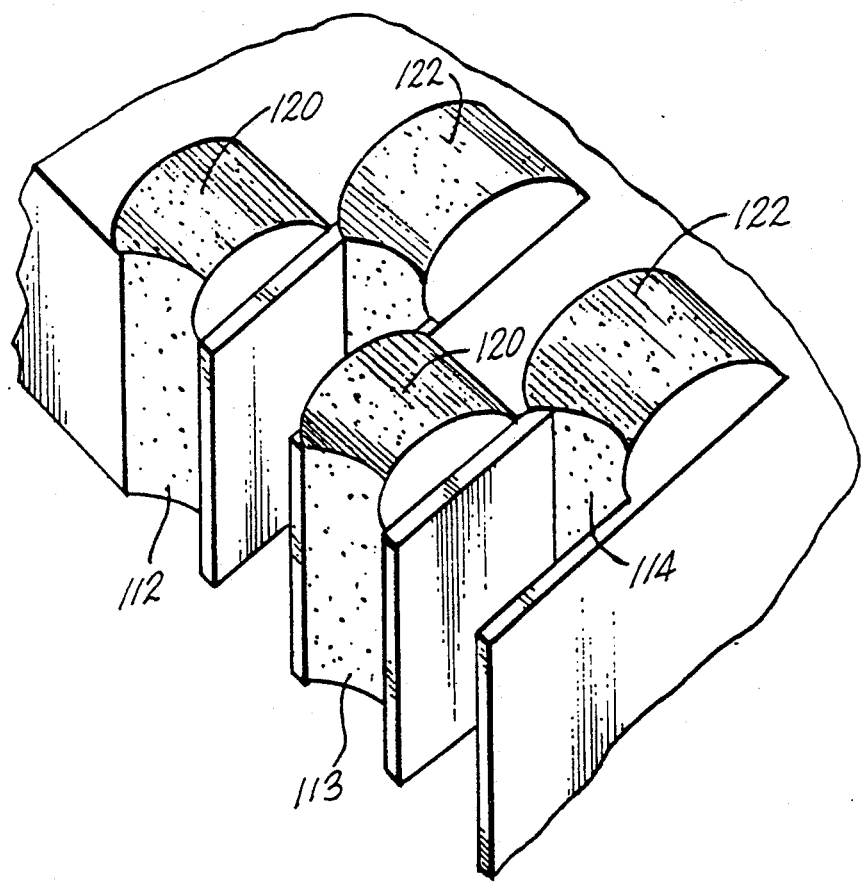
FIG. 12 is a fragmentary perspective view illustrating a bottom portion of the alternative IC carrier.

Although an IC carrier with the lead densities described in relation to FIG. 9 is useful for many applications, FIGS. 10 through 12 illustrate an alternative embodiment in which the carrier can be molded with a more intricate configuration in order to increase lead densities. In the embodiment of FIGS. 10 through 12, there are two rows of alternating, recessed conductive surfaces extending along each side edge of an IC carrier substrate 110. The recessed conductive surfaces face outwardly along each edge and alternate from one row to the next so as to form spaced apart castellations 112 extending laterally outwardly from each edge of the substrate. The outer faces of these castellations are preferably recessed and are aligned in a common plane to form a first outer row of spaced apart conductive surfaces. The gaps 114 left between the adjacent castellations also have recessed conductive surfaces to form a second inner row of spaced apart conductive surfaces. Plated conductive metal traces (schematically illustrated at 116 in FIG. 10) fan outwardly in a pattern from the vicinity of a central cavity 118 on the top surface of the substrate toward the first and second rows of alternating recessed faces along each edge of the substrate. Only a portion of the fan shaped pattern of plated conductors is shown in FIG. 10 for simplicity.

FIGS. 11 and 12 illustrate castellations on a bottom surface of the substrate shown in FIG. 10. In this embodiment, alternating castellations 120 project downwardly from the underside of the first row of castellations 112, and a second row of castellations 122 project downwardly from the second row of conductive surfaces 114. Thus, two parallel rows of alternating castellations are formed along the bottom periphery of the integrated circuit carrier, and all castellations extend to a common plane. The electrically conductive traces 116 are plated on the lower portions of the first and second rows of alternating castellations, and the plating on each of the castellations is electrically separated from the plating on the other castellations. The rear edges of the castellations can either be concave as shown in FIG. 11 or straight as shown in FIG. 12. These figures also illustrate how the castellations are molded so as to maintain physical separation between the conductive surfaces of adjacent castellations.

The embodiment of FIGS. 10 through 12 provides a means for increasing the lead pitch density of the integrated circuit carrier inasmuch as additional conductive traces are plated in spaces normally occupied by wider electrically insulative surfaces separating a single row of castellations.

Figure 13:
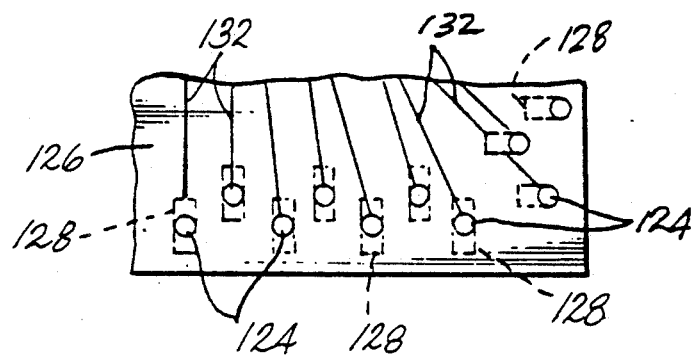
FIG. 13 is a fragmentary top plan view illustrating use of the plated plastic castellated interconnect in an alternative IC carrier with plated thru-holes in contact with castellations on the bottom of the carrier.
Figure 14:
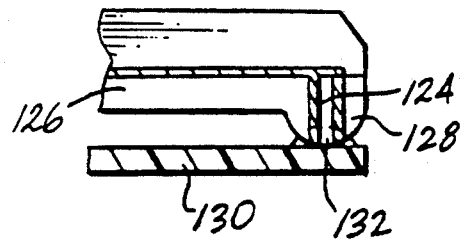
FIG. 14 is a cross-sectional view of the embodiment of FIG. 13.

FIGS. 13 and 14 schematically illustrate a further embodiment of the invention in which the plated plastic castellated interconnect is formed by plated thru-holes or via holes 124 in a plastic substrate 126. The thru-holes are arranged in any desired pattern around the outer periphery of the substrate. In the illustrated embodiment, the plated thru-holes alternate between two parallel rows inboard from each edge of the substrate. Bottom castellations in the form of separate spaced apart integrally molded pads 128 are formed at the base of each of the plated thru-holes. The thru-holes open through a rounded bottom portion of each molded pad. The pads hold the substrate 126 spaced above the top surface of a second component such as a printed circuit board 130. The pads 128 are bonded to contacts on the board. Separate plated conductive metal traces 132 on the upper surface of the substrate form continuous electrical conductors spaced apart from one another and extending through corresponding plated thru-holes to the bottoms of the stand-off pads. Although the bottom surfaces of the pads 128 can be plated, the separate solder joints 132 at the bottom of each plated thru-hole provide an electrical connection between the interior of each plated thru-hole and the corresponding contact on the board.

Interface Between Electrical Sockets and PCB

Figure 15:
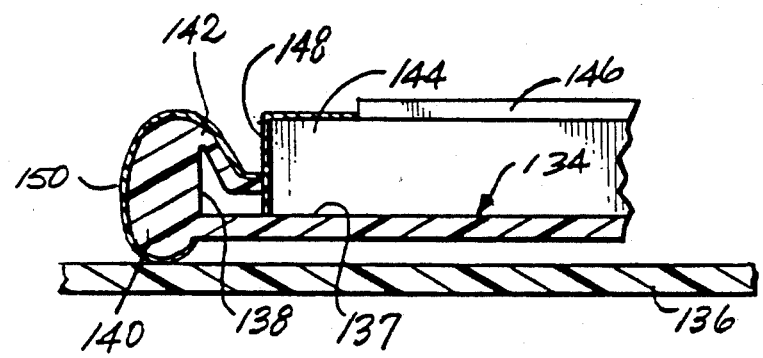
FIG. 15 is a fragmentary cross-sectional view illustrating use of the plated plastic castellated interconnect for the surface connection of an electrical socket to a PCB according to principles of this invention.
Figure 16:
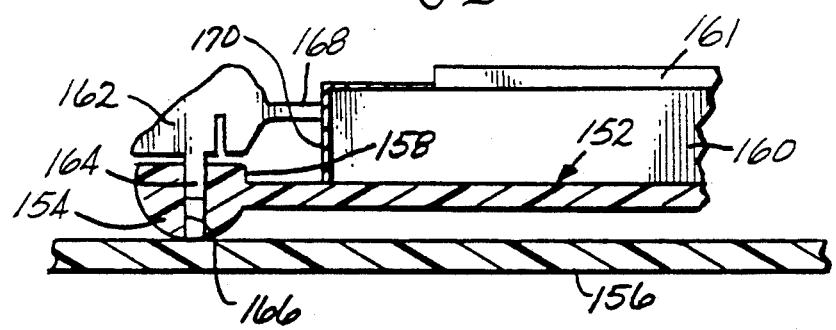
FIG. 16 is a fragmentary cross-sectional view illustrating an alternate embodiment of a plated plastic castellated interconnect in which an electrical socket is mounted to a PCB.
Figure 17:
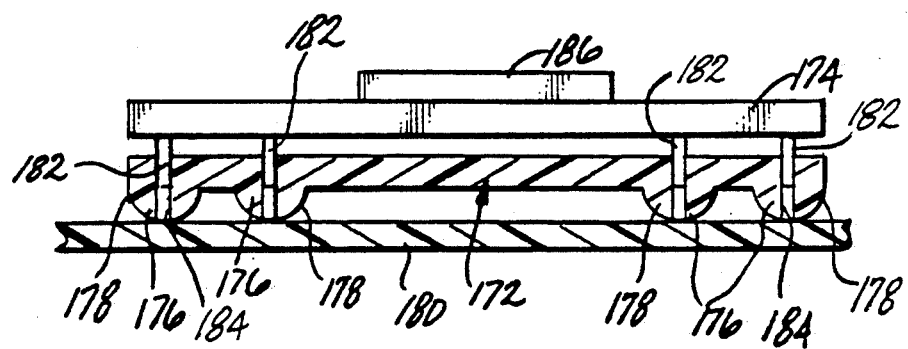
FIG. 17 is a fragmentary cross-sectional view illustrating a further use of the invention for surface mounting a pin grid to a PCB.

FIGS. 15 through 17 illustrate further embodiments of the invention. In addition to the example showing use of the invention as an interface between an IC carrier and a PCB, the plated plastic castellated interconnect can provide surface connections of other electrical components to a support base such as a PCB or a housing, for example. FIG. 15 illustrates use of the invention as an interface for an electrical socket 134 surface mounted to a PCB 136. (The solder joints are not shown in FIGS. 15 through 17 for simplicity.) The socket is made from a molded plastic material and forms an upwardly facing cavity having a flat base 137 and a peripheral side wall 138. Rows of plastic castellations 140, similar to those described in the previous embodiments, project downwardly from the underside of the socket. At each castellation, a separate integrally molded plastic spring 142 (in the form of an inwardly projecting leaf spring type contact) is biased into spring contact with an IC package 144 carrying an IC chip 146. Spaced apart plated metal circuit traces 148 on the package 144 make contact with corresponding continuous plated metal circuit traces 150 extending from the bottoms of the castellations 140 to the exterior of the spring contact 142.

FIG. 16 illustrates an alternative form of a surface mounted castallated plastic interconnect socket 152. This socket has rows of integrally molded plastic castellations 154 surface mounted to a PCB 156. The socket also includes and upwardly facing cavity 158 for receiving an IC package 160 carrying an IC chip 161. In this form of the socket, separate metal springs 162 are connected by pins 164 to plated thru-holes 166 in corresponding castellations 154. The springs include inwardly projecting contacts 168 for making a spring-biased electrical contact with corresponding plated metal circuit traces 170 on the IC package 160. The plated thru-holes 166 provide electrical contact from the solder joints at the bottoms of the castellations, through the plated thru-holes, to the pins 164 and to spring contacts 168, to the electrical circuit traces 170 on the IC package.

Interface Between Carrier for a Pin Grid and PCB

FIG. 17 shows a further alternate embodiment of the plated plastic castellated interconnect in the form of a carrier 172 for a pin grid 174. The carrier 172 has integrally molded castellations 176 with plated metal circuit traces 178 electrically connected to a PCB 180. The pin grid 174 includes a plurality of downwardly facing pins 182 extending into corresponding plated thru-holes 184 in the castellations. Electrical connections from an IC chip 186 on the carrier 174 are made through the corresponding pins 182 to the surface mount connections of the castellations to the contacts on the PCB.

Thus, the plated plastic castellated interconnect of this invention provides for fine lead pitches and resulting higher lead counts than other prior art IC carriers such as those using the metal leadframe, printed wiring board, and ceramic IC carrier techniques. The invention also eliminates the additional expense of using metal leadframe techniques or the additional manufacturing costs and problems associated with ceramic IC carriers. The polymeric substrate can be molded in various geometries which can increase lead pitch densities, including the multiple rows of spaced apart castellations at the bottom of the molded substrate. The molded plastic castellations also can be formed in a geometry and made from a substance which can allow for a certain level of compliancy in surface mount connections while ensuring good contact to a PCB to enhance reliability of the electrical connections. The module maintains alignment and planarity through standard IC testing, shipping and handling. The module also allows for thorough cleaning of fluxes and contaminants between the bottom of the module and the PCB in order to provide reliable connections without electrical failures of the assembled PCB.

What is claimed is:

1. A plated plastic castellated electrical interconnect comprising:
   a substrate made from a molded polymeric material and comprising first and second principal surfaces substantially parallel to each other;
   a plurality of separate, mutually spaced apart and individually compliant castellations integrally molded to the polymeric substrate and projecting from the second surface thereof to a substantially common plane spaced from the second surface, in which the individual castellations are compliant, on a microscopic level, so that the individual castellations are able to flex in three mutually orthogonal directions and thereby compensate for thermal expansion during use; and
   a plurality of electrically separated metal conductors plated to the substrate by metal plating techniques, the substrate including spaced apart recessed regions extending between the first and second surfaces, and in which the castellations are aligned with corresponding recessed regions, each of the plated conductors extending continuously from the first surface, along a corresponding recessed region, to the common plane on a corresponding one of the castellations, the plated metal conductors being adapted for electrical connection to a first electrical component adjacent the first surface of the substrate and the conductors being arranged on the castellations for electrical connection to a second electrical component adjacent the second surface of the substrate.

2. The electrical interconnect according to claim 1 in which the recessed regions are formed by a portion of a hole extending through the entire depth of the substrate from the first surface to the second surface thereof.

3. The electrical interconnect according to claim 1 in which each castellation is immediately inboard from and aligned with a corresponding recessed region.

4. The electrical interconnect according to claim 1 in which the bottoms of the castellations are rounded convexly in a direction substantially perpendicular to the side edge of the substrate.

5. The electrical interconnect according to claim 1 including a cavity on the first surface of the substrate for accommodating the body of the first electrical component.

6. The electrical interconnect according to claim 5 in which the first electrical component comprises an integrated circuit chip.

7. A plated plastic castellated interconnect for electrical components comprising:
   a substrate made from a molded polymeric material having first and second principal surfaces substantially parallel to each other, a plurality of separate, mutually spaced apart and individually compliant castellations integrally molded to the substrate and projecting from the second surface thereof to a substantially common plane spaced from the second surface; and a plurality of separate spaced apart recessed regions on the substrate and aligned with the castellations and extending from the first surface to the second surface of the substrate, in which the individual castellations are compliant, on a microscopic level, so that the individual castellations are able to flex in three mutually orthogonal directions and thereby compensate for thermal expansion during use; the substrate having a plurality of electrically separated metal conductors plated thereon by metal plating techniques, each of the conductors extending continuously from the first surface, along a corresponding one of the castellations.

8. The electrical interconnect according to claim 7 in which the recessed regions are formed by a portion of a hole extending through the entire depth of the substrate from the first surface to the second surface.

9. The electrical interconnect according to claim 7 in which the castellations are immediately inboard from and aligned with each corresponding recess.

10. The electrical interconnect according to claim 7, including:
    a support base having a footprint of electrically conductive contacts matching at least a portion of the castellations on the second surface of the substrate, and means bonding the castellations to the contacts on the support base.

11. The electrical interconnect according to claim 10 in which the support base comprises a printed circuit board.

12. A plated plastic castellated electrical interconnect comprising:
    a substrate made from a molded polymeric material and comprising first and second principal surfaces substantially parallel to each other;
    a plurality of separate, mutually space apart and individually compliant castellations integrally molded to the polymeric substrate and projecting from the second surface thereof to a substantially common plane spaced from the second surface; and
    a plurality of electrically separated metal conductors plated to the substrate by metal plating techniques, each of the plated conductors extending continuously from the first surface of the substrate to the common plane on a corresponding one of the castellations, the plated metal conductors being adapted for electrical connection to a first electrical component adjacent the first surface of the substrate and the conductors being arranged on the castellations for electrical connection to a second electrical component adjacent the second surface of the substrate, the individual castellations being sufficiently compliant to flex in three mutually orthogonal directions and thereby compensate for thermal expansion during use for maintaining the circuit integrity of the connection of the metal plated castellations to the second electrical component.

13. The electrical interconnect according to claim 12 in which the molded polymeric material comprises a thermoplastic material.

14. The interconnect according to claim 12 in which the electrical conductors are plated directly to the substrate and bonded thereto in a continuous metal film having a thickness consisting essentially of the plated conductive metal.

15. The interconnect according to claim 12 in which the conductors are plated to the substrate by metal plating techniques in the group consisting of electroless plating, electroplating, metal sputtering, and vacuum metallizing techniques.

16. A plated plastic castellated electrical interconnect for surface connection of an electrical component to a support base, comprising:
    a substrate made from a molded polymeric material and comprising first and second surfaces substantially parallel to each other;

a plurality of separate mutually spaced apart castellations integrally molded to the substrate and projecting from the second surface thereof to a substantially common plane spaced from the second surface, in which the individual castellations are compliant, on a microscopic level, so that the individual castellations are able to flex in three mutually orthogonal directions and thereby compensate for thermal expansion during use; and a plurality of electrically separated metal conductors plated to the substrate, each of the conductors extending continuously from the first surface, around or through the substrate, to the common plane on a corresponding one of the castellations, the conductors being arranged on the castellations for surface connection to a support base and for electrical connection to an electrical component carried by the substrate and electrically connected to the conductors on the first surface of the substrate;

in which the substrate includes spaced apart recessed regions molded in the side edge of the substrate, and the castellations are aligned with corresponding recessed regions; and the plated conductors extend along a corresponding recessed region to the surface of a corresponding castellation; and in which the spaced apart recessed regions comprise alternating first and second rows of recessed surfaces spaced apart along a portion of the substrate, in which the first recessed surfaces are aligned along a first axis and the second recessed surfaces are aligned along a second axis spaced from and extending substantially parallel to the first axis; and including separate rows of first and second castellations molded to the second surface and positioned adjacent to corresponding first and second recessed surfaces that the separate conductors extend from the first surface, along the first and second recessed surfaces and then to said common plane on the first and second rows of castellations, for thereby increasing the lead count of the integrated circuit carrier.

17. The electrical interconnect according to claim 16 in which the molded polymeric material is a thermoplastic material.

18. A plated plastic castellated electrical interconnect comprising:

a substrate made from a molded polymeric material and having first and second surfaces substantially parallel to each other, a plurality of separate mutually spaced apart castellations integrally molded to the substrate and projecting from the second surface thereof to a substantially common plane spaced from the second surface, and a plurality of separate spaced apart recessed regions molded in the substrate and aligned with the castellations and extending from the first surface to the second surface of the substrate, in which the individual castellations are compliant, on a microscopic level, so that the individual castellations are able to flex in three mutually orthogonal directions and thereby compensate for thermal expansion during use;

the substrate having a plurality of electrically separated metal conductors plated thereon, each of the conductors extending continuously from the first surface, along a surface of the recess and to the common plane on a corresponding one of the castellations;

in which the spaced apart recessed regions comprise alternating first and second recessed surfaces spaced apart along a portion of the substrate, in which the first recessed surfaces are aligned along a first axis and the second recessed surfaces are aligned along a second axis spaced inwardly from and extending substantially parallel to the first axis, and including separate rows of first castellations and second castellations positioned adjacent to corresponding first and second recessed surfaces along corresponding substantially parallel first and second axes, the separate plated conductors extending from the first surface, along the first and second recessed surfaces, and to the first and second castellations, to thereby increase the lead density of the integrated circuit carrier.

19. An electrical interconnect according to claim 18 in which the molded polymeric material is a thermoplastic material.

20. A plated plastic castellated electrical interconnect comprising:

a substrate made from a molded thermoplastic material and comprising first and second principal surfaces substantially parallel to each other;

a plurality of separate, mutually spaced apart and individually compliant castellations integrally molded to the polymeric substrate and projecting from the second surface thereof to a substantially common plane spaced from the second surface; and a plurality of electrically separated metal conductors plated to the substrate by metal plating techniques, the substrate including spaced apart recessed regions extending between the first and second surfaces, and in which the castellations are aligned with corresponding recessed region, to the common plane on a corresponding one of the castellations, the plated metal conductors being adapted for electrical connection to a first electrical component adjacent the first surface of the substrate and the conductors being arranged on the castellations for electrical connection to a second electrical component adjacent the second surface of the substrate.

21. The electrical interconnect according to claim 20 in which the individual castellations are compliant, on a microscopic level, so that the individual castellations are able to flex and thereby compensate for thermal expansion during use.

22. A plated plastic castellated interconnect for electrical components comprising:

a substrate made from a molded thermoplastic material having first and second principal surfaces substantially parallel to each other, a plurality of separate, mutually spaced apart and individually compliant castellations integrally molded to the substrate and projecting from the second surface thereof to a substantially common plane spaced from the second surface; and a plurality of separate spaced apart recessed regions on the substrate and aligned with the castellations and extending from the first surface to the second surface of the substrate, in which the individual castellations are compliant, on a microscopic level, so that the individual castellations are able to flex in three mutually orthogonal directions and thereby compensate for thermal expansion during use; the substrate having a plurality of electrically separated metal conductors plated thereon by metal plating techniques, each of the conductors extending continuously from the first surface, along a surface of a corresponding recess and to a common plane on a corresponding one of the castellations.

23. An electrical interconnect according to claim 20 in which the individual castellations are compliant, on a microscopic level, so that the individual castellation are able to flex and thereby compensate for thermal expansion during use.

24. A plated plastic castellated electrical interconnect comprising:

a substrate made from a molded polymeric material and comprising first and second principal surfaces substantially parallel to each other;

a plurality of separate, mutually spaced apart and individually compliant castellations integrally molded to the polymeric substrate and projecting from the second surface thereof to a substantially common plane spaced from the second surface; and a plurality of electrically separated metal conductors plated to the substrate by metal plating techniques, the substrate including spaced apart recessed regions extending between the first and second surfaces, and in which the castellations are aligned with corresponding recessed regions, each of the plated conductors extending continuously from the first surface, along a corresponding recessed region, to the common plane on a corresponding one of the castellations, the plated metal conductors being adapted for electrical connection to a first electrical component adjacent the first surface of the substrate and the conductors being arranged on the castellations for electrical connection to a second electrical component adjacent the second surface of the substrate, the individual castellations being sufficiently compliant to flex on a microscopic level so as to thereby compensate for thermal expansion during use to maintain the circuit integrity of the connection of the metal plated castellations to the second electrical component.

25. The interconnect according to claim 24 in which the molded polymeric material is a thermoplastic material.

26. A plated plastic castellated interconnect for electrical components comprising:

a substrate made from a molded thermoplastic material having first and second principal surfaces substantially parallel to each other, a plurality of separate, mutually spaced apart and individually compliant castellations integrally molded to the substrate and projecting from the second surface thereof to a substantially common plane spaced from the second surface; and a plurality of separate spaced apart recessed regions on the substrate and aligned with the castellations and extending from the first surface to the second surface of the substrate; the substrate having a plurality of electrically separated metal conductors plated thereon by metal plating techniques, each of the conductors extending continuously from the first surface, along a surface of a corresponding recess and to a common plane on a corresponding one of the castellations, the individual castellations being sufficiently compliant to flex to thereby compensate for thermal expansion during use to maintain the circuit integrity of connections of the metal plated castellations to corresponding terminals on an electrical component to which the interconnect is connected.

* * * * *

UNITED STATES PATENT AND TRADEMARK OFFICE
CERTIFICATE OF CORRECTION

PATENT NO. : 5,069,626

DATED : December 3, 1991

INVENTOR(S) : Timothy P. Patterson; Carl E. Hoge; Joseph Baia

It is certified that error appears in the above-identified patent and that said Letters Patent is hereby corrected as shown below:

Column 7, line 21, before "latter" insert -- the --.

Column 12, line 38, after "dimension" change "a" to -- $a$ --.
Column 12, line 39, after "distance" change "b" to -- $b$ --.
Column 12, line 40, after "spacing" change "c" to -- $c$ --.
Column 12, line 41, after "width" change "d" to -- $d$ --.
Column 12, line 42, after "spacing" insert -- $e$ --.

Column 14, line 19, after "includes" change "and" to -- an --.

In the Claims

Column 16, line 3, after "along a" insert -- surface of a corresponding recess and to a common plane on a --.
Column 16, line 27, after "mutually" change "space" to -- spaced --.

UNITED STATES PATENT AND TRADEMARK OFFICE
CERTIFICATE OF CORRECTION

PATENT NO. : 5,069,626

DATED : December 3, 1991

INVENTOR(S) : Timothy P. Patterson; Carl E. Hoge; Joseph Baia

It is certified that error appears in the above-identified patent and that said Letters Patent is hereby corrected as shown below:

Column 18, line 35, after "recessed" change "region," to -- regions, --; and after "regions," and before "to" insert -- each of the plated conductors extending continuously from the first surface along a corresponding recessed region, --.

Column 19, line 7, change "castellation" to -- castellations --.

Signed and Sealed this

Eighth Day of June, 1993

Attest:

MICHAEL K. KIRK

*Attesting Officer*    Acting Commissioner of Patents and Trademarks